(12) United States Patent
Reber et al.

(10) Patent No.: US 9,508,702 B2
(45) Date of Patent: *Nov. 29, 2016

(54) 3D DEVICE PACKAGING USING THROUGH-SUBSTRATE POSTS

(71) Applicant: FREESCALE SEMICONDUCTOR, INC., Austin, TX (US)

(72) Inventors: Douglas M Reber, Austin, TX (US); Mehul D. Shroff, Austin, TX (US); Edward O. Travis, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/169,254

(22) Filed: Jan. 31, 2014

(65) Prior Publication Data

US 2015/0091160 A1   Apr. 2, 2015

Related U.S. Application Data

(63) Continuation-in-part of application No. 14/039,622, filed on Sep. 27, 2013.

(51) Int. Cl.
*H01L 23/48* (2006.01)
*H01L 23/52* (2006.01)
(Continued)

(52) U.S. Cl.
CPC ............ *H01L 25/50* (2013.01); *H01L 21/561* (2013.01); *H01L 23/3185* (2013.01); *H01L 23/481* (2013.01); *H01L 24/16* (2013.01); *H01L 24/81* (2013.01); *H01L 25/0657* (2013.01); *H01L 24/13* (2013.01); *H01L 2224/0401* (2013.01); *H01L 2224/04042* (2013.01); *H01L 2224/04073* (2013.01); *H01L 2224/056* (2013.01); *H01L 2224/05571* (2013.01); *H01L 2224/05624* (2013.01); *H01L 2224/05639* (2013.01); *H01L 2224/05644* (2013.01);
(Continued)

(58) Field of Classification Search
USPC .................. 257/E23.001–E23.194, 678–733, 257/787–796, E21.499–E21.519, 100, 433, 257/434, 667, E31.117–E31.118, E51.02, 257/E33.066, 690; 438/6, 66, 67, 107, 109, 438/406, 455–459, 396, 124, 15, 613, 614, 438/652
See application file for complete search history.

(56) References Cited

U.S. PATENT DOCUMENTS

| 5,218,234 A | 6/1993 | Thompson et al. |
| 5,766,982 A | 6/1998 | Akram et al. |

(Continued)

OTHER PUBLICATIONS

Gilles Poupon et al., "From the Single Chip to the Wafer Integration", CEA-LETI Minatec, Gernoble, France, Jan. 2002, 7 pages.
(Continued)

*Primary Examiner* — Tram H Nguyen

(57) ABSTRACT

A method for 3D device packaging utilizes through-substrate metal posts to mechanically and electrically bond two or more dice. The first die includes a set of access holes extending from a surface of the first die to a set of pads at a metal layer of the first die. The second die includes a set of metal posts. The first die and the second die are stacked such that each metal post extends from a surface of the second die toward a corresponding pad via a corresponding access hole. The first die and second die are mechanically and electrically bonded via solder joints formed between the metal posts and the corresponding pads.

20 Claims, 8 Drawing Sheets

(51) Int. Cl.
*H01L 29/40* (2006.01)
*H01L 25/00* (2006.01)
*H01L 23/00* (2006.01)
*H01L 25/065* (2006.01)
*H01L 23/31* (2006.01)
*H01L 21/56* (2006.01)

(52) U.S. Cl.
CPC ............ *H01L 2224/05647* (2013.01); *H01L 2224/05655* (2013.01); *H01L 2224/05684* (2013.01); *H01L 2224/1134* (2013.01); *H01L 2224/131* (2013.01); *H01L 2224/13023* (2013.01); *H01L 2224/13082* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13169* (2013.01); *H01L 2224/14131* (2013.01); *H01L 2224/14517* (2013.01); *H01L 2224/16111* (2013.01); *H01L 2224/16147* (2013.01); *H01L 2224/16237* (2013.01); *H01L 2224/16238* (2013.01); *H01L 2224/17181* (2013.01); *H01L 2224/81191* (2013.01); *H01L 2224/81815* (2013.01); *H01L 2224/94* (2013.01); *H01L 2924/12042* (2013.01); *H01L 2924/15788* (2013.01)

(56) References Cited

U.S. PATENT DOCUMENTS

| | | | |
|---|---|---|---|
| 5,973,396 A | 10/1999 | Farnworth | |
| 5,998,292 A | 12/1999 | Black et al. | |
| 6,038,136 A | 3/2000 | Weber | |
| 6,168,972 B1 | 1/2001 | Wang et al. | |
| 6,207,475 B1 | 3/2001 | Lin et al. | |
| 6,245,595 B1 | 6/2001 | Nguyen et al. | |
| 6,297,548 B1 * | 10/2001 | Moden | H01L 23/13 257/686 |
| 6,400,008 B1 * | 6/2002 | Farnworth | H01L 23/481 257/621 |
| 6,774,497 B1 | 8/2004 | Qi et al. | |
| 6,872,594 B2 * | 3/2005 | Gebauer | H01L 21/76898 257/E21.597 |
| 7,579,215 B2 | 8/2009 | Swirbel | |
| 7,982,298 B1 * | 7/2011 | Kang | H01L 25/03 257/621 |
| 8,021,930 B2 | 9/2011 | Pagaila | |
| 8,030,770 B1 | 10/2011 | Juskey et al. | |
| 8,294,279 B2 | 10/2012 | Chen et al. | |
| 2003/0151139 A1 * | 8/2003 | Kimura | H01L 23/49827 257/737 |
| 2006/0281223 A1 | 12/2006 | Liu et al. | |
| 2009/0057918 A1 * | 3/2009 | Kim | H01L 25/0657 257/777 |
| 2010/0102444 A1 * | 4/2010 | Khor | H01L 21/561 257/737 |
| 2011/0068427 A1 * | 3/2011 | Paek | H01L 24/19 257/433 |
| 2011/0316123 A1 * | 12/2011 | Sasaki | H01L 25/0657 257/620 |
| 2012/0012990 A1 * | 1/2012 | Pagaila | H01L 23/5389 257/659 |
| 2012/0199981 A1 * | 8/2012 | Jeong | H01L 23/481 257/774 |
| 2013/0012015 A1 | 1/2013 | Oh et al. | |
| 2013/0032925 A1 * | 2/2013 | Kitano | H01L 23/5225 257/532 |
| 2013/0062757 A1 | 3/2013 | Feger et al. | |
| 2013/0119549 A1 | 5/2013 | Cheng et al. | |
| 2013/0161795 A1 * | 6/2013 | Owada | H01L 21/6835 257/620 |
| 2014/0284785 A1 * | 9/2014 | Sung | H01L 25/0657 257/692 |

OTHER PUBLICATIONS

Beth Keser et al., "Advanced Packaging: The Redistributed Chip Package", IEEE Transactions on Advanced Packaging, Feb. 2008, pp. 39-43.

Xuejun Fan, "Wafer Level Packaging (WLP): Fan-in, Fan-out and Three-Dimensional Integration", 11th. Int. Conf. on Thermal, Mechanical and Multiphysics Simulation and Experiments in Micro-Electronics and Micro-Systems, Apr. 2010, pp. 1-7.

George A. Riley, "Micro-Posts: Tall, Slender, Stud Bumps", <http://flipchips.com/tutorial/bump-technology/micro-posts-tall-slender-stud-bumps/>, Apr. 2003, 1 page.

Laurie S. Roth et al., "Step 2: Stud Bump Bonding", <http://electroiq.com/blog/2005/02/step-2-stud-bump-bonding/>, Accessed Jun. 30, 2014, 5 pages.

"Dage 4000Plus Bond Tester", <http://www.sinerji-grup.com/bond-tester-systems/dage-4000plus-bond-tester>, Accessed Jun. 30, 2014, 1 page.

"Glass-coated Bonding Wire Targets Copper, Small Diameter Market", <http://electroiq.com/blog/2012/03/glass-coated-bonding-wire-targets-copper-small-diameter-market/>, Accessed Jun. 30, 2014, 4 pages.

U.S. Appl. No. 14/303,128, filed Jun. 12, 2014, entitled "3D Device Packaging Using Through-Substrate Posts".

U.S. Appl. No. 14/039,622, filed Sep. 27, 2014, entitled "3D Device Packaging Using Through-Substrate Pillars".

Daniel D. Evans, Jr., "Geometry and Bond Improvements for Wire Ball Bonding and Ball Bumping", 39th International Symposium on Microelectronics (IMAPS 2006) Proceedings, Oct. 8-12, 2006, 7 pages.

PC Magazine, "Detail of flip-chip bond, stud bump in solder well", <http://www.pcmag.com/image_popup/0%2c1740%2ciid=15942%2c00.asp> Accessed Jul. 3, 2014, 1 page.

A.C. Fischer et al., "Low-Cost Through Silicon Vias (TSVs) With Wire-Bonded Metal Cores and Low Capacitive Substrate-Coupling", Micro Electro Mechanical Systems (MEMS), IEEE 23rd International Conference, Jan. 24, 2010, 4 pages.

Non-Final Office Action mailed Mar. 4, 2015 for U.S. Appl. No. 14/039,511, 32 pages.

Non-Final Office Action mailed Mar. 4, 2015 for U.S. Appl. No. 14/303,128, 33 pages.

Final Office Action mailed Aug. 26, 2015 for U.S. Appl. No. 14/303,128, 30 pages.

Final Office Action mailed Aug. 28, 2015 for U.S. Appl. No. 14/039,622, 28 pages.

Non-Final Office Action mailed Dec. 4, 2015 for U.S. Appl. No. 14/303,128, 31 pages.

Notice of Allowance dated Feb. 9, 2016 from U.S. Appl. No. 14/039,622.

Non-final office action dated Apr. 21, 2016 in U.S. Appl. No. 14/039,622.

Final office action dated May 10, 2016 in U.S. Appl. No. 14/303,128.

Notice of Allowance dated Jul. 7, 2016 in U.S. Appl. No. 14/303,128.

Notice of Allowance dated Jul. 20, 2016 in U.S. Appl. No. 14/039,622.

* cited by examiner

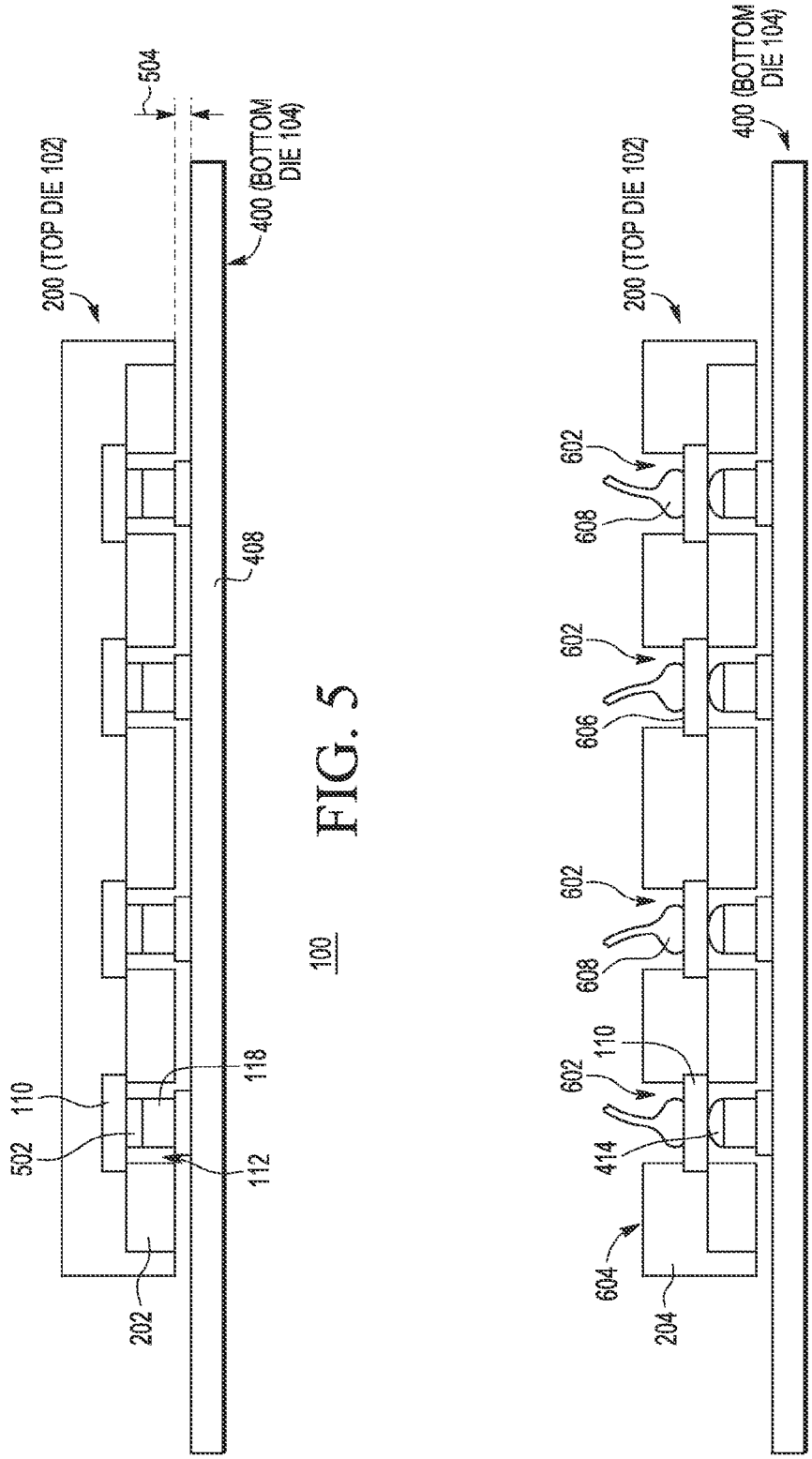

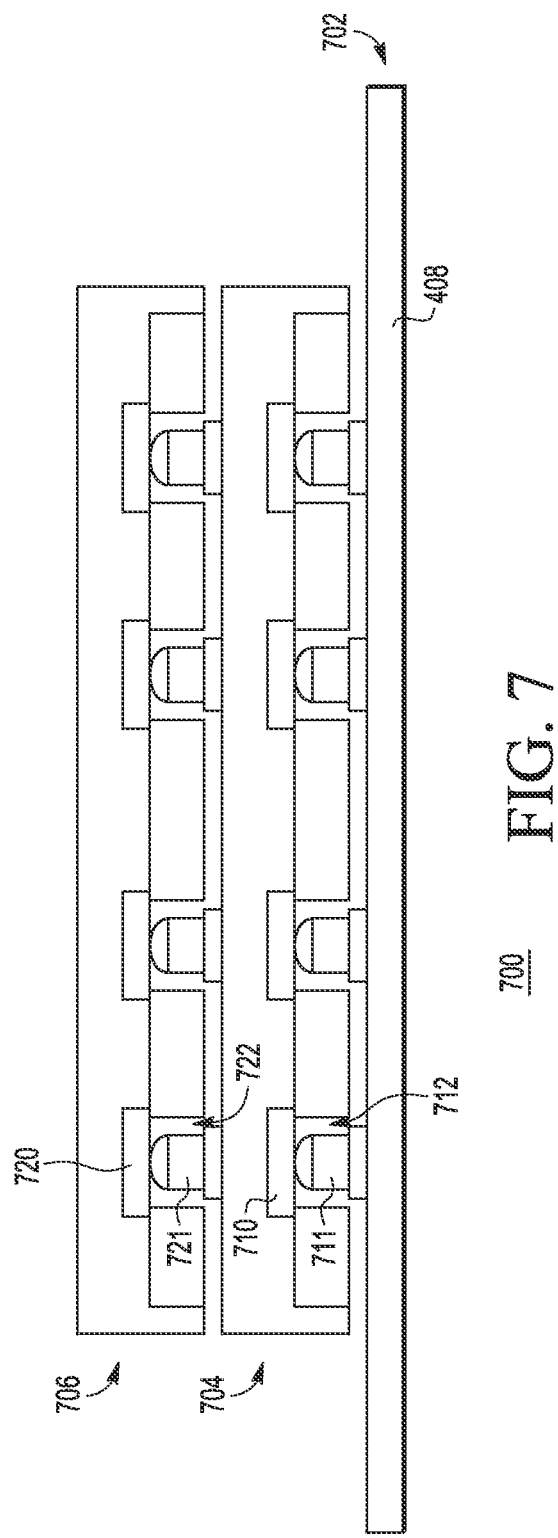

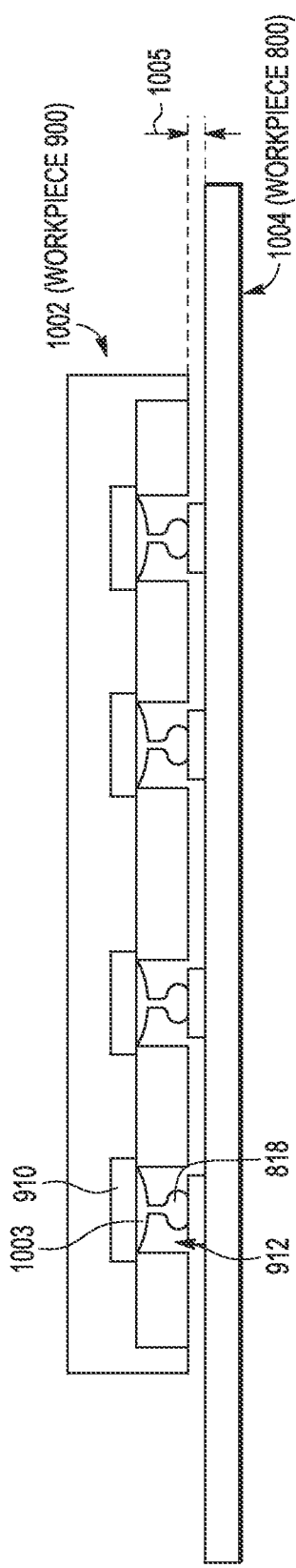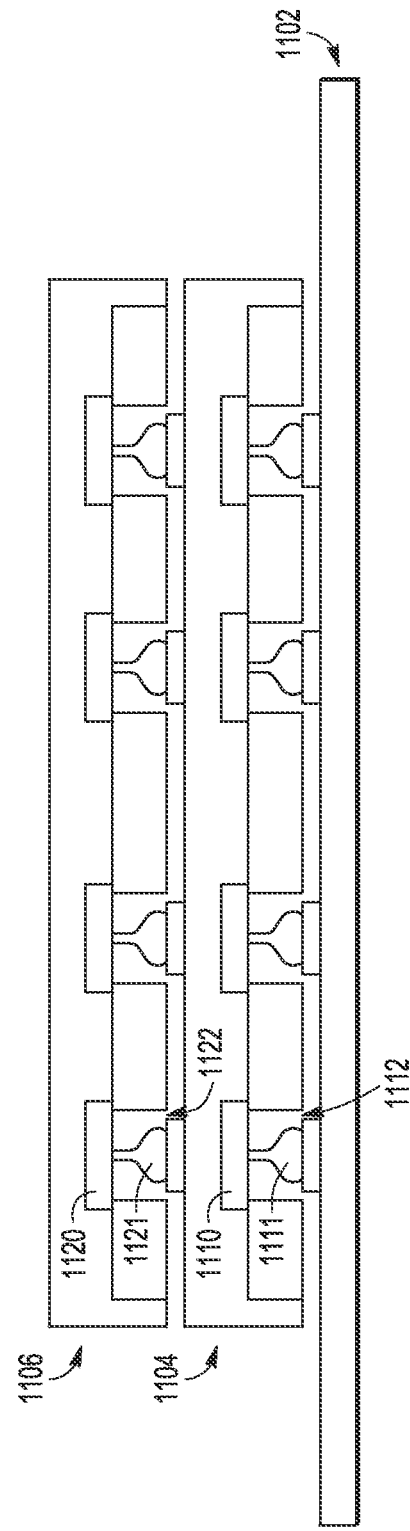

3D DEVICE PACKAGING USING THROUGH-SUBSTRATE POSTS

CROSS-REFERENCE TO RELATED APPLICATIONS

The present application is a continuation-in-part application of U.S. patent application Ser. No. 14/039,622, entitled "3D DEVICE PACKAGING USING THROUGH-SUBSTRATE PILLARS" and filed on Sep. 27, 2013, the entirety of which is incorporated by reference herein.

BACKGROUND

1. Field of the Disclosure

The present disclosure relates generally to device packaging, and more particularly to three-dimensional (3D) stacked die packaging.

2. Description of the Related Art

Electronic devices often utilize 3D integrated circuit (IC) packaging to stack two or more dice in a package, which provides a smaller footprint compared to a single larger die or side-by-side dice connected via an interposer.

A common 3D packaging approach for stacking two dice employs a pillar-to-pillar die stacking technique wherein copper pillar bumps are formed on each die and the two dice are then bonded such that each pillar on one die aligns with, and comes into contact with, a corresponding pillar on the other die so as to form a mechanical and electrical bond. However, the copper pillars must be aligned with precision; if one die is angled relative to the other, or the copper pillar bumps are otherwise misaligned, they may not wet (i.e. electrically and mechanically bond). In an attempt to prevent non-wetting, many non-electrically active pillars are added to the dice, increasing the footprint of the technique. Moreover, this pillar-to-pillar die stacking technique creates a large void, or standoff, between the two dice that requires underfill, as well as dams to prevent lateral disbursement of the underfill.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 5 is a cross-section view of a 3D package formed by the bonding of the top die and bottom die of FIG. 4 in accordance with some embodiments.

FIG. 6 is a cross-section view of the 3D package of FIG. 5 having a set of wire bonds formed on the pads of the top die via pad openings formed in an encapsulant layer of the top die in accordance with some embodiments.

FIG. 7 is a cross-section view of a 3D package having three dice stacked and bonded using a through-substrate pillar bonding technique in accordance with some embodiments.

FIG. 10 is a cross-section view of a 3D package formed by the bonding of the top die and bottom die of FIG. 9 in accordance with some embodiments.

FIG. 11 is a cross-section view of a 3D package having three dice stacked and bonded using a through-substrate stud bump bonding technique in accordance with some embodiments.

DETAILED DESCRIPTION

FIGS. 1-11 illustrate example techniques for 3D device packaging using a through-substrate post bonding technique to bond two or more dice in a die stack. A "top" die includes a set of pads and an arrangement of a set of access holes formed at a bottom surface of the top die, extending through the top die to the pads. A "bottom" die includes a set of metal posts disposed at a top surface of the bottom die in an arrangement corresponding to the arrangement of the set of access holes of the first die. The top die and the bottom die are bonded in a stacked configuration by inserting the set of metal posts into the set of access holes such that each metal post contacts a pad, and then may be mechanically and electrically coupled to the pad, such as through a solder reflow process that forms a solder joint between the metal post and the corresponding pad.

As illustrated in greater detail below with reference to FIGS. 1-7, in some embodiments the metal posts may comprise metal pillars formed using, for example, an electroplating process. Using the electroplating process, the pads are treated to ensure good electrical contact and adhesion of the metal pillar to the die. Then the metal is plated to a thickness sufficient that the metal pillars are formed to the desired height.

Alternatively, as illustrated in greater detail below with reference to FIGS. 8-11, in some embodiments the metal posts may comprise stud bumps formed using, for example, a wire-bonding-based process. Using the modified wire bonding technique, a wire ball is formed at a tip of a wire threaded through a capillary of a wire bonding tool. The wire bonding tool manipulates the capillary to bring the distal portion of the wire ball into contact with a bond pad and initiates cold welding, or bonding, of the wire ball to the bond pad through a combination of heat, pressure, and ultrasonic vibration energy applied to the capillary. When the wire ball has welded to the bond pad, the bonding tool manipulates the capillary to cause the wire to break or separate from the wire ball to form the stud bump.

The terms "top" and "bottom" are used herein to reference the relative positioning or placement of certain components relative to the view orientation of the corresponding figure in which they are depicted. The terms "top" and "bottom" as used herein do not necessarily indicate that a "top" component is above a "bottom" component as such directions and/or components may be flipped, rotated, moved in space, placed in a diagonal orientation or position, placed horizontally or vertically, or similarly modified.

Figure 1:
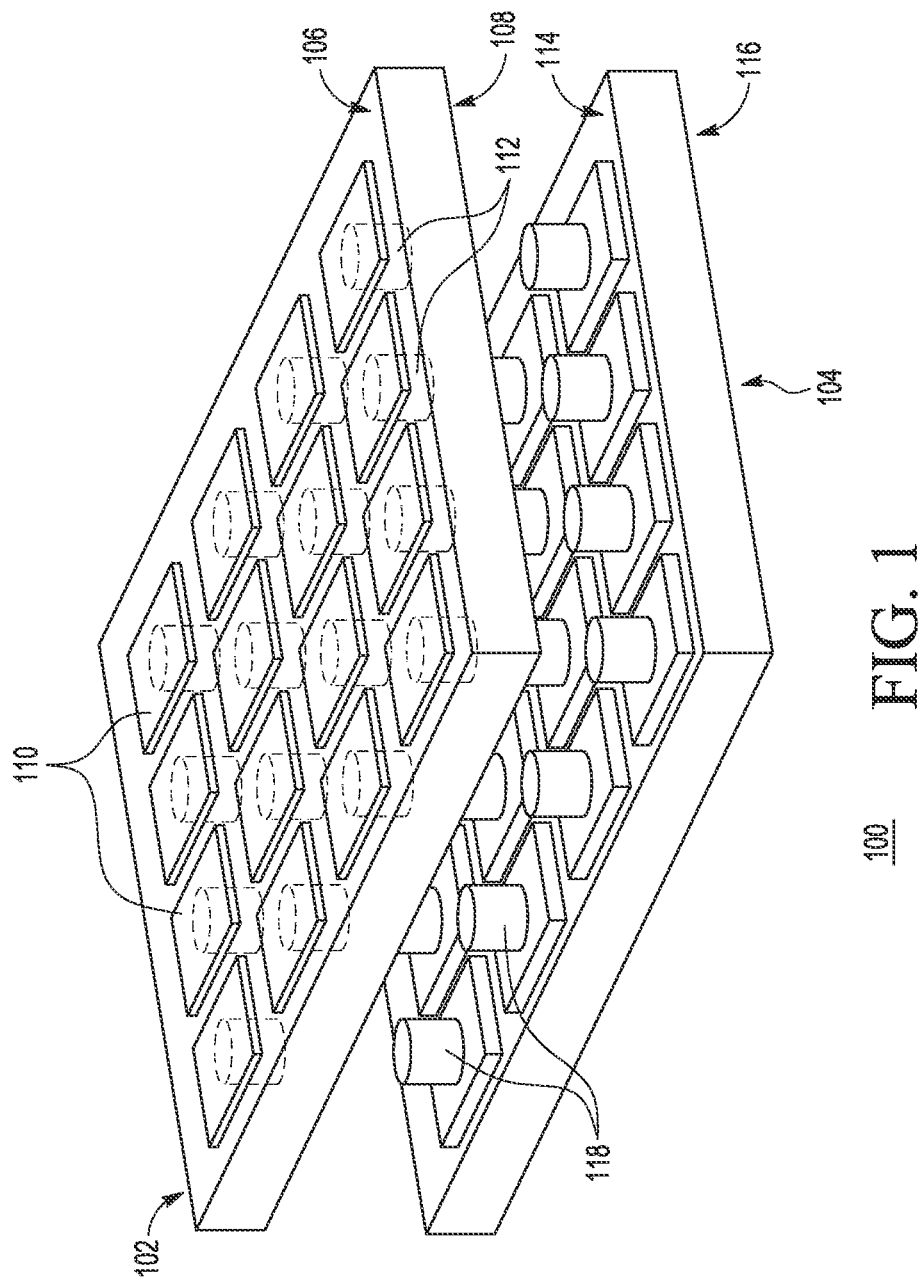
FIG. 1 is an exploded perspective view of a 3D die package implementing a through-substrate pillar bonding technique to bond a top die and a bottom die in accordance with some embodiments.

FIG. 1 illustrates an exploded view of a 3D device package 100 implementing through-substrate metal posts in the form of metal pillars in accordance with some embodiments. The 3D device package 100 typically is configured to be electrically coupled to a printed circuit board (PCB) or other carrier for implementation in an electronic device, which may include, for example, an electronic control system of an automobile or other vehicle, a portable electronic device such as a cellular phone, tablet computer, or notebook computer, a desktop computer, a server, and the like.

In the depicted example, the 3D device package 100 comprises a top die 102 bonded to a bottom die 104 ("top" and "bottom" being relative to the orientation of FIG. 1). Each of the top die 102 and the bottom die 104 comprises one or more substrate layers upon which semiconductor integrated circuit devices or microelectromechanical systems (MEMS) are formed during a front-end-of-line (FEOL) process and one or more metal layers upon which metal interconnects are formed during a back-end-of-line (BEOL) process. The one or more substrate layers can comprise, for example, a single crystal silicon die, a composite wafer of an insulating substrate, such as an epitaxial die, a silicon-on-insulator (SOI) die, or a liquid crystal display (LCD) glass substrate and a semiconductor layer, and the like.

The top die 102 comprises two opposing major surfaces, labeled top surface 106 and bottom surface 108. The top die 102 includes a set of pads 110 disposed in a specified arrangement at one of the metal layers proximate to the top surface 106. For ease of illustration, the set of pads 110 are illustrated as formed at the top metal layer of the top die 102, but in other embodiments the set of pads 110 may be formed at a lower metal layer, or above the top metal layer. The top die 102 further includes a set of access holes 112 in an arrangement compatible with the arrangement of pads 110 such that each access hole 112 is coaxially aligned with a corresponding pad 110 and extends from the bottom surface 108 to the underlying surface of the corresponding pad 110. In some embodiments, the walls of the access holes 112 are substantially perpendicular (90 degrees+/−10 degrees) to the bottom surface 108, thereby allowing a higher density of such access holes. In some embodiments, the bottom surface 108 corresponds with a backside of the top die 102, and the access holes 112 are formed at the backside of the top die 102.

The bottom die 104 likewise comprises two major opposing surfaces, labeled top surface 114 and bottom surface 116. The bottom die 104 includes a set of metal pillars 118 disposed at the top surface 114 in an arrangement corresponding to the arrangement of the access holes 112. The set of metal pillars 118 extend away from the bottom die 104 in a direction substantially perpendicular to the top surface 114. For ease of illustration, the metal pillars 118 are described herein in the example context of copper (Cu) pillars, but in other embodiments the metal pillars 118 may be composed of other metals, such as aluminum (Al), gold (Au), silver (Ag), platinum (Pt), nickel (Ni), or a combination of metals. The metal pillars 118 and the access holes 112 are dimensioned such that the metal pillars 118 can be inserted into the access holes 112 when the top die 102 and the bottom die 104 are stacked or bonded to form the 3D device package 100, as described below. In some embodiments, a layer of dielectric may be formed on the inside surface of the access holes 112 to provide insulation between the metal pillars 118 of the bottom die 104 and the substrate of the top die 102.

For ease of illustration, the sizes of the pads 110, access holes 112, and metal pillars 118 are exaggerated relative to the dice 102, 104. Moreover, although FIG. 1 depicts sixteen pads 110 in a uniform 4×4 grid arrangement (as well as sixteen access holes 112 and sixteen metal pillars 118 in corresponding 4×4 grid arrangements), in typical implementations the numbers of pads 110, access holes 112, and metal pillars 118 typically are much greater than the sets of sixteen of each as shown, and these components may be compatibly arranged in arrangements other than a grid (e.g., an approximate ring, perimeter, checkerboard pattern, etc.).

Although depicted in an exploded view in FIG. 1, during fabrication of the 3D device package 100, the top die 102 and the bottom die 104 are bonded together with the bottom surface 108 of the top die 102 facing the top surface 114 of the bottom die 104. The corresponding arrangements of the set of metal pillars 118, the set of access holes 112, and the set of pads 110 result in the insertion of each metal pillar 118 into a corresponding access hole 112 during the die bonding process. Moreover, the height of the metal pillars 118 is compatible with the substrate thickness of the top die 102 between the metal layer containing the set of pads 110 and the bottom surface 108 such that the metal pillar 118 is brought into contact with the pad 110 overlying the corresponding access hole 112 during the die stacking process. The metal pillars 118 may be tipped with solder material so that after the dice 102, 104 are stacked, a solder reflow process may be performed to form a solder joint between the metal pillar 118 and the pad 110, thus forming a mechanical and electrical bond between the metal pillar 118 and the corresponding pad 110.

With electrical pathways formed between the top die 102 and the bottom die 104 via the pads 110 and the metal pillars 118, some or all of the pads 110 and the metal pillars 118 may be used to conduct signaling or power between the dice 102, 104. In such instances, the pads 110 are connected to the metal interconnect structure formed in the metal layers of the die 102 and the metal pillars 118 are connected to the metal interconnect structure formed in the metal layers of the die 104. Power and signaling therefore may be conducted between the top die 102 and the bottom die 104 via these metal interconnect structures, the metal pillars 118, and the pads 110. Moreover, in some instances, some or all of the metal pillar-pad junctions may be electrically inactive, that is, not used for conducting signaling or power between the dice 102, 104, and instead used solely for bolstering the mechanical bonding between the dice 102, 104 or otherwise bolstering the structural integrity of the resulting 3D device package 100. In such instances, one or both of the metal pillar 118 and the pad 110 of an electrically-inactive pillar-pad junction may be electrically isolated from the other metal interconnects of the corresponding die.

As illustrated with greater detail below with reference to FIG. 5, this front-through-back approach of connecting the metal pillars 118 of the bottom die 104 to the pads 110 of the top die 102 through the substrate of the top die 102 (that is, through the "back end" of the top die 102) reduces the risk of non-wetting pillar connections compared to conventional pillar-to-pillar stacking approaches. Moreover, this approach reduces the standoff distance between the bottom surface 108 of the top die 102 and the top surface 114 of the bottom die 104, and thus facilitates the fabrication of a more compact die stack while reducing or eliminating the need for underfill between the two dice, as well as the need for dam structures to contain such underfill between the two dice.

FIGS. 2-6 sequentially illustrate an example process of fabricating the 3D device package 100 using a through-substrate pillar bonding technique. As with the view depicted in FIG. 1, the dimensions of the metal pillars, access holes, and pads are exaggerated relative to other features of the dice 102, 104 for purposes of illustration.

Figure 2:
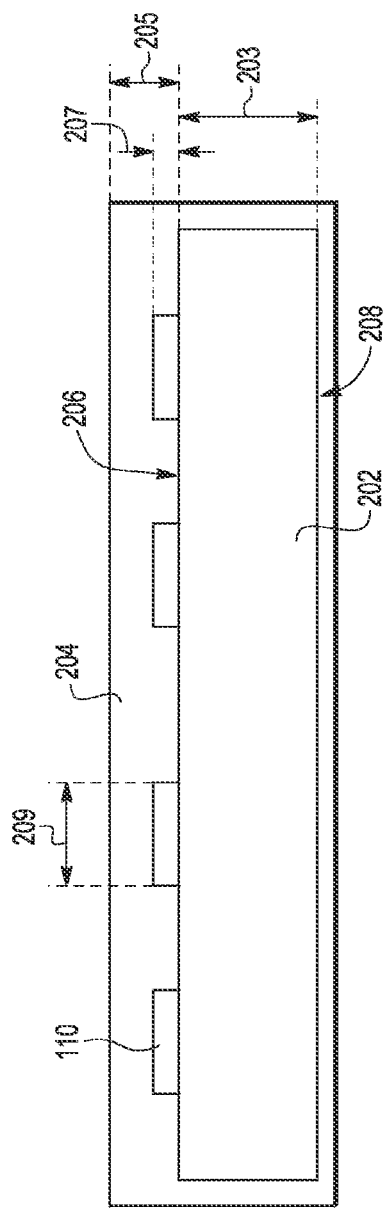
FIG. 2 is a cross-section view of a top die after formation of a set of pads at a surface metal layer in accordance with some embodiments.

FIG. 2 illustrates a cross-section view of a workpiece 200 that ultimately forms the top die 102 of FIG. 1 in accordance with some embodiments. In the depicted stage, a die 202 (corresponding to the top die 102) having an initial thickness 203 has been singulated from a wafer and encapsulated in an encapsulating material 204, such as a heat-curable epoxy-based resin. In some embodiments the encapsulating material 204 may be applied before die singulation and thus the encapsulating material 204 may cover only the top surface 206 (corresponding to the top surface 106, FIG. 1) of the die 202 to a thickness 205, while in other embodiments the die 202 may be encapsulated after singulation, and thus the encapsulating material 204 may cover the top surface 206, the opposing bottom surface 208, and side surfaces of the die 202. An example range of the die thickness 203 10-300 µm, and an example range of the encapsulant thickness 205 at the top surface 206 is 50-400 µm.

In the depicted example, the pads 110 are formed at the surface, or top, metal layer of the die 202, and thus the encapsulating material 204 may directly overlie the pads 110 and any passivation layer formed over the pads 110. The pads 110 may be composed of any of a variety of conductive materials or combinations thereof, such as aluminum, copper, gold, silver, tungsten, nickel, and the like. As noted, the pads 110 are used to contact corresponding metal pillars inserted through the bottom surface 108 of the top die 102, and thus the pads 110 are formed to a thickness 207 suitable to reduce the likelihood of flexion of the pads responsive to this contact. To illustrate, a pad thickness 207 of at least 5,000 angstroms has been found to sufficiently guard against excessive flexion of the pads 110. Moreover, the pads 110 have a width 209 greater than the diameter of the access holes 112 (FIG. 1) formed thereunder, and thus permitting the pads 110 to sufficiently bridge over the openings of the access holes 112. An example range of the pad width 209 is 20-200 µm.

Figure 3:
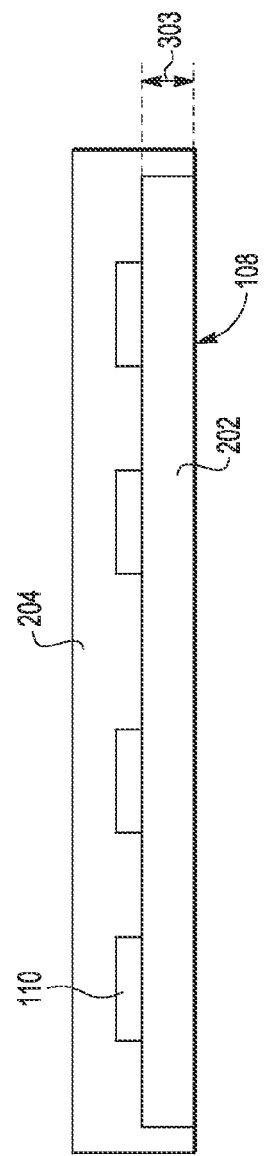
FIG. 3 is a cross-section view of the top die of FIG. 2 after back-grinding a bottom surface of the top die in accordance with some embodiments.

FIG. 3 illustrates a cross-section view of the workpiece 200 after backgrinding of the die 202 at the bottom surface 208 (FIG. 2), and any encapsulant material 204 that may have initially overlain the bottom surface 208. The backgrinding may be performed using any of a variety of suitable techniques, for example mechanical backgrinding, chemical backgrinding, and the like. In some instances, the backgrinding is performed on a wafer prior to die singulation, and in other instances the backgrinding may be performed on the die 202 after singulation. The backgrinding reduces the distance between the bottom surface 108 of the top die 102 and the underside of the pads 110 to a reduced thickness 303 that corresponds to a height of the metal pillars 118 (FIG. 1) less a specified standoff between the bottom surface 108 of the top die 102 (FIG. 1) and the top surface 114 (FIG. 1) of the bottom die 104 (FIG. 1). That is, if the pads 110 are disposed at a top surface 206 of the die 202, the die 202 is backgrounded to a reduced thickness 303 so that when the workpiece 200 (as the top die 102) is bonded to the bottom die 104, the metal pillars 118 reach the undersides of the pads 110 while a bottom surface 108 of the die 202 is separated from the top surface 114 of the bottom die 104 by a specified standoff distance.

Figure 4:
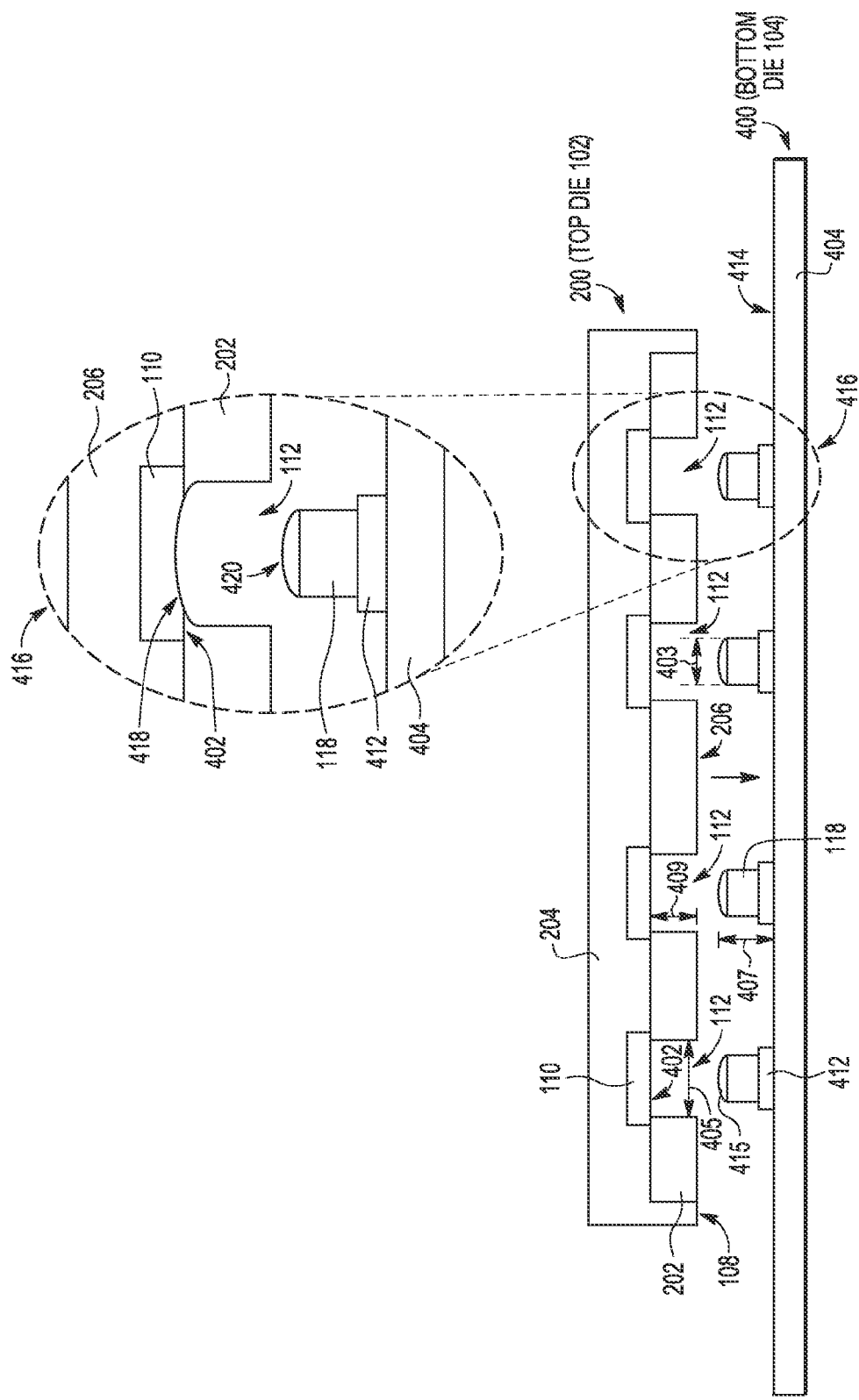
FIG. 4 is a cross-section view of the top die of FIG. 3 after formation of a set of access holes and a cross-section view of a bottom die having a set of metal pillars formed in an arrangement compatible with the set of access holes in accordance with some embodiments.

FIG. 4 illustrates cross-section views of the workpiece 200 (corresponding to the top die 102) and a workpiece 400 (corresponding to the bottom die 104) in the process of stacking or bonding the workpieces 200, 400. In the depicted view, the set of access holes 112 have been formed at the bottom surface 108 of the encapsulated die 202. Each access hole 112 extends substantially perpendicular from the bottom surface 108 to an underlying surface 402 of a corresponding pad 110 of the set of pads 110. The access holes 112 may be formed using any of a variety of suitable techniques, such as etching, mechanical drilling, laser ablation, and the like. In some embodiments, the bottom surface 108 corresponds to a backside of the encapsulated die 202, and the access holes 112 are formed at the backside of the encapsulated die 202.

The workpiece 400 comprises a die 404 (corresponding to the bottom die 104 of FIG. 1) having the set of metal pillars 118 formed at a top surface 414 of the die 404 in an arrangement compatible with the arrangement of pads 110 and access holes 112 in the workpiece 200. The metal pillars 118 may be formed using any of a variety of conventional pillar formation techniques. In some embodiments, the metal pillars 118 are seated on a base 412. The metal pillars 118 each include a contact surface, which may comprise a solder deposit 415 to create a solder joint between the metal pillar 118 and the pad 110 once the workpieces 200, 400 have been stacked and bonded. The metal pillars 118 have a diameter 403 (e.g., 5-150 µm) less than a diameter 405 (e.g., 5.1-155 µm) of the access holes 112 and a height 407 (e.g., 10.2-300.2 µm) greater than a depth 409 (e.g., 10-300.1 µm) of the access holes 112, thereby permitting the metal pillars 118 to extend into the access holes 112 and contact the underlying surfaces 402 of the pads 110.

As illustrated by detail view 416, in some embodiments the end "caps" of the access holes 112 are formed to correspond to the shape of the contact surface 420 of the corresponding metal pillars 118. For example, a concave surface 418 may be formed in the substrate of the top die 202 and in the underlying surface 402 of the pad 110 by, for example, selective etching to correspond to a convex contact surface 420 of the corresponding metal pillar 118. In some embodiments, the concave surface 418 may be formed only in the underlying surface 402 of the pad 110. This concave surface 418 provides a seat to help align the metal pillars 118 in the access holes 112 as the workpieces 200, 400 are joined.

FIG. 5 illustrates a cross-section view of the 3D device package 100 resulting from the bonding of the workpiece 200 (representing the top die 102) and the workpiece 400 (representing the bottom die 104). At the depicted stage, the metal pillars 118 have been inserted into the corresponding access holes 112 such that the contact surface 420 of each metal pillar 118 is brought into contact with the underlying surface 402 (FIG. 4) of the corresponding pad 110 and a solder reflow is performed to create a solder joint 502 between the metal pillar 118 and the corresponding pad 110, and thus electrically and mechanically coupling metal pillars 118 with the corresponding pads 110. As illustrated in FIG. 5, using this through-substrate pillar bonding technique, the metal pillars 118 and pads 110 provide mechanical and electrical connections between the dice 102, 104 in a manner that brings the facing surfaces of the dice 102, 104 closer together, resulting in a reduced standoff height 504 between the dice 102, 104, which in turn reduces or eliminates the need for underfill and underfill-containing dam structures, as well as provides for more reliable wetting of the metal pillars 118 during the bonding process.

FIG. 6 illustrates a cross-section view of a 3D device package 600 in which pad openings for test probing or wire bond formation may be formed. In the depicted embodiment, the 3D device package 600 was formed in accordance with the process described above with reference to FIGS. 1-5. As a further processing step, to provide access to the pads 110 a set of pad openings 602 are formed to extend from a top surface 604 of the encapsulant material 204 to top surfaces 606 of some or all of the pads 110. The pad openings 602 may be formed using etching, laser ablation, mechanical drilling, and the like. These pad openings 602 may be used to provide test probes access to the pads 110 during a test process, or to facilitate the formation of wire bonds 608 with the pads 110.

FIG. 7 illustrates a 3D device package 700 formed from three dice stacked in accordance with the through-substrate pillar bonding technique described herein. As illustrated, the 3D device package 700 is formed from three dice 702, 704, 706, with the die 702 having a set of metal pillars 711 bonded to pads 710 of the die 704 via access holes 712 formed at the backside of the die 704. Similarly, the die 704 has a set of metal pillars 721 formed at the topside of the die 704, and which are bonded to pads 720 of the die 706 via access holes 722 formed at the backside of the die 706. While in the present example the metal pillars 711 of die 702 align with the metal pillars 721 of die 704, in other embodiments, the metal pillars 711 of die 702 do not align with the metal pillars 721 of die 704, and the metal pillars of any given die in a 3D device package need not be arranged to correspond with the metal pillars of another die in the stack. In some embodiments, die 704 may have metal pillars 721 formed directly on the pads 710 such that the metal pillars 721 are electrically and mechanically coupled to the pads 710. This same process may be extended to stack more than three die. Furthermore, the through-substrate pillar bonding technique may be employed in combination with other die bonding techniques to form a multiple-die stack in a 3D device package.

FIGS. 1-7 primarily illustrate embodiments of 3D packaging techniques using through-substrate metal posts in the form of metal pillars. Turning now to FIGS. 8-11, embodiments of 3D packaging techniques using through-substrate metal posts in the form of stud bumps are illustrated. As with the metal-pillar-based 3D package 100 illustrated in FIG. 1, a stud-bump-based implementation also provides for the formation of an array of metal posts (in the form of stud bumps) at a bottom die that electrically and mechanically couple with corresponding pads in a top die via access holes formed in the substrate of the top die. In view of this similarity to the metal pillar implementation, the stud bump implementation is described below with reference to the analogous context of the 3D package 100 of FIG. 1.

Figure 8:
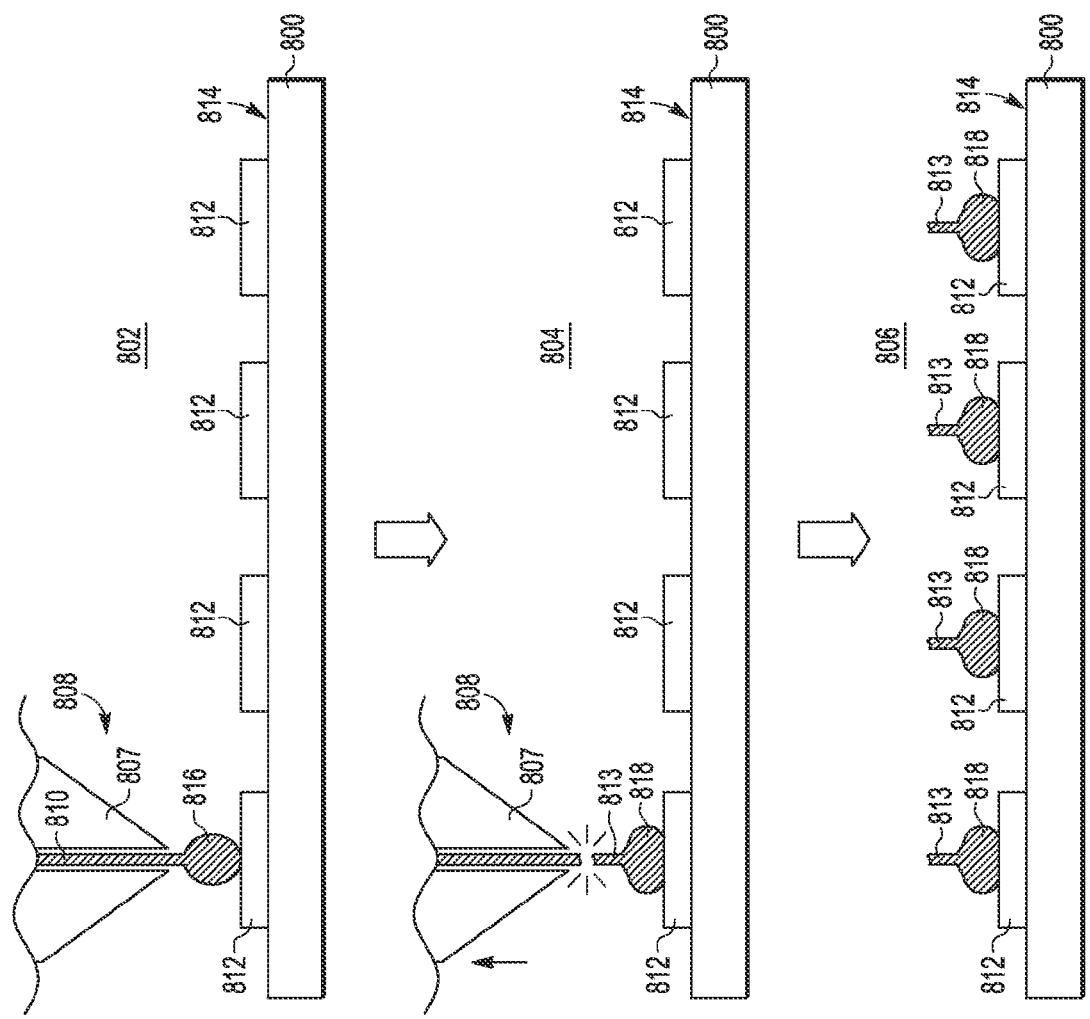
FIG. 8 is a series of cross-section views illustrating formation of stud bumps at a bottom die of a 3D package in accordance with some embodiments.

FIG. 8 illustrates a series of cross-section views 802, 804, 806 depicting an example technique for forming stud bumps 818 on a workpiece 800 using a wire bonding tool 808 in accordance with some embodiments. The workpiece 800 represents a bottom die (analogous to the bottom die 104) of a stub-bump-based 3D package 1000 (see FIG. 10) to be formed. The workpiece 800 is shown as having a plurality of bond pads 812 disposed at a top surface 814 of the workpiece 800 in an arrangement (e.g., an array or grid as shown for the 3D package 100 of FIG. 1) corresponding to the arrangement of access holes in a top die of the 3D package 1000 (FIG. 10). The bond pads 812 may be composed of any of a variety of materials or combinations thereof, such as gold (Au), silver (Ag), palladium (Pd), copper (Cu), aluminum (Al), nickel (Ni), composite materials, and the like.

Cross-section views 802 and 804 illustrate the process of forming a single stud bump 818 at a corresponding bond pad 812, and this process may be repeated for each stud bump 818 to be formed at the workpiece 800. As illustrated by cross-section view 802, a wire ball 816 is formed at a tip of a wire 810 threaded through a capillary 807 of a wire bonding tool 808. The wire 810 can comprise any of a variety of relatively soft metals or metal alloys, such as Au, Ag, Cu, Al, Palladium-Silver (PdAg), and the like. The wire ball 816 may be formed as a free air ball created through the melting of the tip of the wire 810 using, for example, an electronic flame off (EFO) process. As illustrated by cross-section view 804, the wire bonding tool 808 manipulates the capillary 807 to bring the distal portion of the wire ball 816 into contact with the bond pad 812 of the workpiece 800. The bonding tool 808 initiates cold welding, or bonding, of the wire ball 816 to the bond pad 812 through a combination of heat, pressure, and ultrasonic vibration energy applied to the capillary 807. When the wire ball 816 has welded to the bond pad 812, the bonding tool 808 manipulates the capillary 807 to draw the capillary 807 away from the bond pad 812, which in turn causes the wire 810 to break or separate from the wire ball 816, and thus forming the stud bump 818, which includes the wire ball 816 and a tail 813 of wire extending generally perpendicular to the top surface 814 As illustrated by cross-section view 804, this stud bump formation technique is repeated so as to form a stud bump 818 at each bond pad 812 of the workpiece 800.

Figure 9:
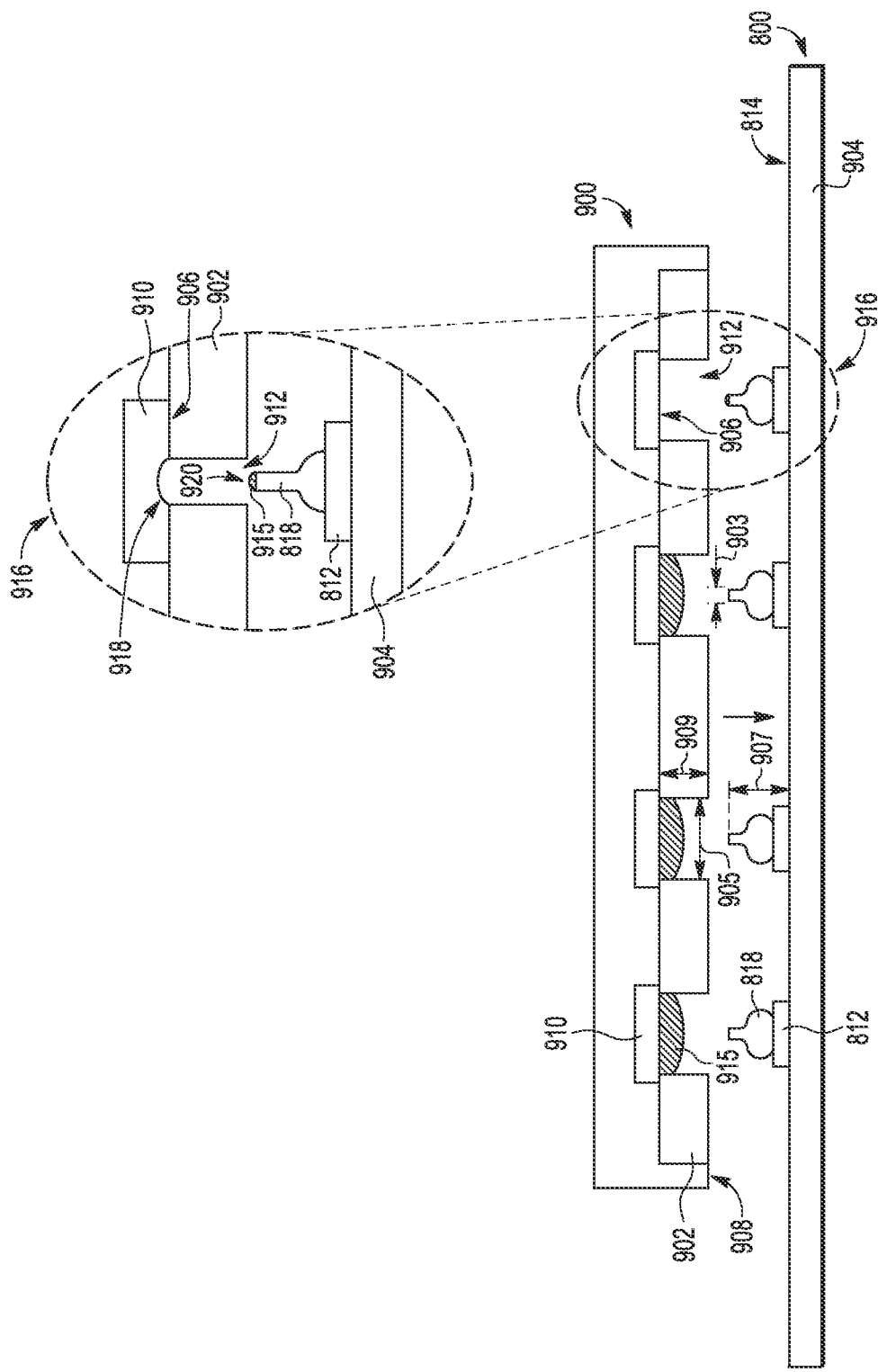
FIG. 9 is a cross-section view of a top die after formation of a set of access holes and a cross-section view of a bottom die having a set of stud bumps formed in an arrangement compatible with the set of access holes in accordance with some embodiments.

FIG. 9 illustrates a cross-section view of the workpiece 800 and a workpiece 900 in the process of being stacked or otherwise bonded to form the 3D package 1000 (FIG. 10). As noted above, the workpiece 800 is a bottom die analogous to the bottom die 104 of the 3D package 100 of FIG. 1. Similarly, the workpiece 900 is a top die analogous to the top die 102 of the 3D package 100. In the depicted view, a set of access holes 912 (analogous to the access holes 112 of FIG. 1) have been formed at the bottom surface 908 of an encapsulated die 902 (analogous to the encapsulated die 202 of FIG. 2). Each access hole 912 extends substantially perpendicular from the bottom surface 908 to an underlying surface 906 of a corresponding pad 910 of a set of pads formed at one or more metal layers of the workpiece 900. The access holes 912 may be formed using any of a variety of suitable techniques, such as etching, mechanical drilling, laser ablation, and the like. In some embodiments, the bottom surface 908 corresponds to a backside of the encapsulated die 902.

The workpiece 800 comprises a die 904 (analogous to the bottom die 104 of FIG. 1) having the set of stud bumps 818 formed at the top surface 814 of the die 904 in an arrangement compatible with the arrangement of pads 910 and access holes 912 in the workpiece 900. In some embodiments, the stud bumps 818 are seated on a base or bond pad 812.

The stud bumps 818 and the access holes 912 are dimensioned such that the stud bumps 818 can be inserted into the access holes 912 when a bottom die formed from the workpiece 800 and a top die formed from the workpiece 900 are stacked or bonded to form the 3D device package 1000, as described below with reference to FIG. 10. To illustrate, the stud bumps 818 have a diameter 903 (e.g., 5-150 μm) less than a diameter 905 (e.g., 5.1-155 μm) of the access holes 912 and a height 907 (e.g., 10.2-300.2 μm) greater than a depth 909 (e.g., 10-300.1 μm) of the access holes 912, thereby permitting the stud bumps 818 to extend into the access holes 912 and contact the underlying surfaces 902 of the pads 910. In some embodiments, a layer of dielectric material may be formed on the inside surface of the access holes 912 to provide insulation between the stud bumps 818 of the bottom die 904 and the substrate of the top die 102.

As illustrated by detailed view 916, the stud bumps 818 each include a contact surface 920. In some embodiments, a solder deposit 915 is formed at the contact surface 920 for use in creating a solder joint between the stud bump 818 and the corresponding pad 910 once the workpieces 800, 900 have been stacked and bonded. However, it can be impractical to accurately deposit solder material on the stud bump 818 itself. Thus, in some embodiments, solder material is deposited in the access holes 912 against the underlying surfaces 902 of the bond pads 910 so as to form solder fills 915 in the access holes 912. These solder fills 915 are then used to form solder joints between the stud bumps 818 (or the metal pillars 118 in the embodiment described above with reference to FIGS. 1-7) and the access pads 910 via solder reflow.

As also illustrated by detail view 916, in some embodiments implementing the solder deposit 915 formed at the contact surface 920 of each stud bump 818, the end "caps" of the access holes 912 are formed with a contour that corresponds to the shape of the contact surface 920 of the corresponding stud bumps 818. For example, a concave surface 918 may be formed in the substrate of the top die 202 and in the underlying surface 906 of the pad 110 via, for example, selective etching to correspond to a convex contact surface 920 of the corresponding stud bump 818. In some embodiments, the concave surface 918 may be formed only in the underlying surface 906 of the pad 910. This concave surface 918 provides a seat to help align the stud bumps 818 in the access holes 912 as the workpieces 800, 900 are joined.

FIG. 10 illustrates a cross-section view of a 3D device package 1000 resulting from the bonding of a top die 1002 (formed from the processing of the workpiece 900 described above) and a bottom die 1004 (formed from the processing of the workpiece 800 described above) using stud bumps 818 as the metal posts interconnecting the two. At the depicted stage, the stud bumps 818 have been inserted into the corresponding access holes 912 such that the contact surface 920 of each stud bump 818 is brought into contact with the underlying surface 906 (FIG. 9) of the corresponding pad 910 and a solder reflow is performed of the solder fills 915 (FIG. 9) disposed in the access holes 912 so as to create a solder joint 1003 between each stud bump 818 and its corresponding pad 910, and thus electrically and mechanically coupling stud bumps 818 with the corresponding pads 910. Using this through-substrate stud bump bonding technique, the stud bumps 818 and pads 910 provide mechanical and electrical connections between the dice 1002, 1004 in a manner that brings the facing surfaces of the dice 1002, 1004 closer together, resulting in a reduced standoff height 1005 between the dice 1002, 1004, which in turn reduces or eliminates the need for underfill and underfill-containing dam structures, as well as provides for more reliable wetting of the stud bumps 818 during the bonding process.

FIG. 11 illustrates a 3D device package 1100 formed from three dice stacked in accordance with the through-substrate stud bump bonding technique described herein. As illustrated, the 3D device package 1100 is formed from three dice 1102, 1104, 1106, with the die 1102 having a set of stud bumps 1111 bonded to pads 1110 of the die 1104 via access holes 1112 formed at the backside of the die 1104. Similarly, the die 1104 has a set of stud bumps 1121 formed at the topside of the die 1104, and which are bonded to pads 1120 of the die 1106 via access holes 1122 formed at the backside of the die 1106. While in the present example the stud bumps 1111 of die 1102 align with the stud bumps 1121 of die 1104, in other embodiments, the stud bumps 1111 of die 1102 do not align with the stud bumps 1121 of die 1104, and the stud bumps of any given die in a 3D device package need not be arranged to correspond with the stud bumps of another die in the stack. In some embodiments, die 1104 may have stud bumps 1121 formed directly on the pads 1110 such that the stud bumps 1121 are electrically and mechanically coupled to the pads 1110. This same process may be extended to stack more than three die. Furthermore, the through-substrate stud bump bonding technique may be employed in combination with other die bonding techniques to form a multiple-die stack in a 3D device package.

Similar to the metal pillar 3D device package 600 described above with reference to FIG. 6, in some embodiments, a stud bump implementation of a 3D device package may comprise pad openings for test probing or wire bond formation. The set of pad openings may be formed (using etching, laser ablation, mechanical drilling, and the like) to extend from a top surface of the encapsulant material to the top surfaces of some or all of the pads (e.g., like pads 110 of FIG. 6). These pad openings may be used to provide test probes access to the pads of the stud bump implementation of the 3D device package during a test process, or to facilitate the formation of wire bonds with the pads.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method comprising:
    stacking a first semiconductor die with a second semiconductor die, the first semiconductor die comprising a first set of access holes extending from a first surface of the first semiconductor die to a first set of pads at a metal layer of the first semiconductor die and the second semiconductor die comprising a first set of metal posts, each metal post of the first set of metal posts extending from a surface of the second semiconductor die toward a first surface of a corresponding pad of the first set of pads via a corresponding access hole of the first set of access holes; and bonding the first semiconductor die and the second semiconductor die such that the metal posts of the first set of metal posts are electrically coupled to the corresponding pads of the first set of pads.

2. The method of claim 1, further comprising:
forming the first set of metal posts as a set of stud bumps using a wire bonding process.

3. The method of claim 2, further comprising:
depositing solder material at the first surface of the first set of pads via the first set of access holes; and
wherein bonding the first semiconductor die and the second semiconductor die comprises performing a solder reflow of the solder material to form solder joints coupling the stud bumps with the corresponding pads of the first set of pads.

4. The method of claim 1, further comprising:
encapsulating the first semiconductor die with an encapsulating material; and
forming a set of pad openings, each pad opening of the set of pad openings extending from a surface of the encapsulating material to a second surface of a corresponding pad of the first set of pads.

5. The method of claim 1, further comprising:
stacking a third semiconductor die with the first semiconductor die, the third semiconductor die comprising a second set of access holes extending from a surface of the third semiconductor die to a second set of pads at a metal layer of the third semiconductor die and the first semiconductor die comprising a second set of metal posts, each metal post of the second set of metal posts extending from a second surface of the first semiconductor die toward a surface of a corresponding pad of the second set of pads via a corresponding access hole of the second set of access holes.

6. A method comprising:
providing a first semiconductor die comprising: a set of pads at a metal layer of the first semiconductor die; a set of access holes in a first arrangement at the first semiconductor die, each access hole of the set of access holes extending from a surface of the first semiconductor die to a corresponding pad of the set of pads; and solder material at a corresponding pad of each access hole of the set of access holes; and bonding the first semiconductor die to a second semiconductor die, the second semiconductor die comprising a set of stud bumps disposed at a surface of the second semiconductor die in a second arrangement corresponding to the first arrangement, the set of stud bumps extending into the first semiconductor die via the set of access holes such that each stud bump of the set of stud bumps contacts the solder material at a corresponding pad of the set of pads.

7. The method of claim 6, wherein bonding the first semiconductor die to the second semiconductor die comprises:
performing a solder reflow to form solder joints coupling the stud bumps with the corresponding pads.

8. The method of claim 6, wherein each access hole of the set of access holes comprises a concave surface at a first surface of the corresponding pad.

9. The method of claim 6, wherein the first semiconductor die further comprises an encapsulating material encapsulating the first semiconductor die and a set of pad openings, each pad opening of the set of pad openings extending from a surface of the encapsulating material to a second surface of a corresponding pad of the set of pads.

10. The method of claim 9, further comprising:
forming a wire bond with the second surface of a pad of the set of pads via a corresponding pad opening of the set of pad openings.

11. The method of claim 6, wherein the metal layer comprises a surface metal layer of the first semiconductor die.

12. A device package comprising:
a first semiconductor die comprising:
a first metal layer comprising a first set of pads; and
a set of access holes in a first arrangement, each access hole of the set of access holes extending from a first surface of the first semiconductor die to a first surface of a corresponding pad of the first set of pads; and
a second semiconductor die bonded to the first semiconductor die, the second semiconductor die comprising:
a first set of metal posts disposed in a second arrangement corresponding to the first arrangement at a surface of the second semiconductor die that faces the surface of the first semiconductor die, each metal post of the first set of metal posts extending toward and electrically coupled to the first surface of a corresponding pad of the first set of pads via a corresponding access hole of the set of access holes.

13. The device package of claim 12, further comprising:
a solder joint spanning each access hole of the set of access holes at the first surface of the corresponding pad of the first set of pads.

14. The device package of claim 12, wherein the metal posts comprise stud bumps.

15. The device package of claim 12, wherein each metal post of the first set of metal posts is electrically and mechanically coupled to the corresponding pad via a solder joint.

16. The device package of claim 12, wherein at least one access hole of the set of access holes comprises a concave surface at least partially formed at the first surface of the corresponding pad of the first set of pads.

17. The device package of claim 12, further comprising:
an encapsulating material encapsulating the first semiconductor die; and
a set of pad openings formed through the encapsulating material to a second surface of a pad of the first set of pads.

18. The device package of claim 17, further comprising:
a wire bond disposed in at least one pad opening of the set of pad openings at the second surface of the pad.

19. The device package of claim 12, wherein the first surface of the first semiconductor die is characterized as a backside of the first semiconductor die.

20. The device package of claim 12, wherein:
the first semiconductor die further comprises:
a second set of metal posts disposed in a third arrangement at a second surface of the first semiconductor die;
and the device package further comprises:
a third semiconductor die bonded to the first semiconductor die, the third semiconductor die comprising:

a second metal layer comprising a second set of pads; and a second set of access holes in a fourth arrangement corresponding to the third arrangement, each access hole of the second set of access holes extending from a surface of the third semiconductor die that faces the second surface of the first semiconductor die to a surface of a corresponding pad of the second set of pads such that each metal post of the second set of metal posts extends, via a corresponding access hole of the second set of access holes, toward and electrically couples to the surface of the corresponding pad of the second set of pads.

\* \* \* \* \*